United States Patent [19]

Smith, Jr. et al.

[11] Patent Number: 4,785,142

[45] Date of Patent: Nov. 15, 1988

[54] SUPERCONDUCTOR CABLE

[75] Inventors: Darrell F. Smith, Jr., Huntington; Bill L. Lake, Ona, both of W. Va.; Ronald G. Ballinger, Andover, Mass.

[73] Assignee: Inco Alloys International, Inc., Huntington, W. Va.

[21] Appl. No.: 36,581

[22] Filed: Apr. 10, 1987

[51] Int. Cl.$^4$ ............................................. H01B 12/00
[52] U.S. Cl. .............................. 174/15 S; 174/102 A; 174/125.1; 420/95; 420/97; 420/447; 505/887
[58] Field of Search ............... 174/15 S, 126 S, 128 S; 420/95, 97, 103, 447

[56] References Cited

U.S. PATENT DOCUMENTS

| | | | |
|---|---|---|---|
| 3,726,985 | 4/1973 | Aupoix et al. | 174/15 S |
| 4,066,447 | 1/1978 | Smith, Jr. et al. | 420/95 X |
| 4,184,042 | 1/1980 | Vulis et al. | 174/15 S |
| 4,200,459 | 4/1980 | Smith, Jr. et al. | 420/447 |
| 4,327,244 | 4/1982 | Horvath et al. | 174/15 S |
| 4,333,228 | 6/1982 | Koch | 174/15 S X |
| 4,395,584 | 7/1983 | Ries | 174/15 S |
| 4,568,900 | 2/1986 | Ngatsuma et al. | 174/15 S X |

FOREIGN PATENT DOCUMENTS 1410732  10/1975  United Kingdom ................. 420/95

Primary Examiner—Morris H. Nimmo
Attorney, Agent, or Firm—Raymond J. Kenny; Francis J. Mulligan, Jr.

[57] ABSTRACT

A superconducting cable comprising an in-situ-formed type II superconductor, e.g. $Nb_3Sn$, in association with a stabilizing conductor both in heat transfer relationship with at least one passage adapted to carry liquified gaseous refrigerant. The conductor and said at least one passage are enclosed by a sheath comprising an alloy consisting essentially of about 49% nickel, about 4% chromium, about 3% niobium, about 1.4% titanium, about 1% aluminum, balance essentially iron.

4 Claims, No Drawings

SUPERCONDUCTOR CABLE

The present invention is concerned with superconductor cables and, advantageously, with superconductive cables containing a brittle, intermetallic type II superconductor.

BACKGROUND AND PROBLEM

Any superconductor cable must include, in addition to the superconductor, stabilizing conductor and passage for liquified gaseous coolant, an enclosing conduit or sheath which will retain the cable components. When the superconductor is an intermetallic compound such as $Nb_3Sn$, it is often times advantageous to form the compound in situ, that is after the essentials of the cable have been constructed, assembled and formed. This is true because intermetallic compounds are often very brittle and will rupture if subjected to more than a minimum of deformation. On the other hand, the precursors of the intermetallic compound can usually be obtained in ductile form. Generally, formation of the superconductive intermetallic compound (or composition) entails heating of the precursor materials to temperatures of the order of 1000° K. or higher for a considerable time period. The formed cable containing the intermetallic superconductor is then cooled, eventually to cryogenic temperatures of about 4° K. In order to prevent damage due to thermally induced strain and to minimize lowering of the critical current carrying capacity of the superconductor, the sheathing of the cable should reasonably match the superconducting compound in coefficient of expansion over the range of about 0° K. to 1000° K. In addition, the cable sheath or conduit must have adequate mechanical characteristics at cryogenic temperatures and adequate properties at 1000° K. or higher from the stress accelerated grain boundary oxidation (SAGBO) criterion.

It is an object of the present invention to provide a superconducting cable having a sheath or conduit which is adapted to perform in a satisfactory manner both during formation of the superconductive material and during use of the cable under cryogenic conditions.

DESCRIPTION OF THE INVENTION

The present invention contemplates a superconducting cable comprising an elongated superconductor in association with a parallel stabilizing conductor both being in heat transfer relationship with at least one passage adapted to carry liquified gaseous refrigerant. The superconductor, the conductor and the at least one passage are enclosed by a sheath comprising an alloy consisting essentially of about 49% nickel, about 4% chromium, about 3% niobium, about 1.4% titanium, about 1% aluminum with the balance being essentially iron.

Preferably a type II superconductor is used in the cable of the present invention. A commonly used example of this type of superconductor is $Nb_3Sn$ preferably in the form of a plurality of strands made up of a multiplicity of microscopic filaments of the intermetallic compound. The strands along with associated conductor, e.g. copper, present either interiorly or exteriorly with respect to the strands, are supported in a spaced apart array advantageously approximating in cross-section a close hexagonal packing. The spaces or voids between the strands are adapted to contain liquified gaseous refrigerant, e.g. liquid helium or liquid hydrogen. Surrounding the array of strands is the sheath or conduit which confines the strands and the refrigerant and, as usual in such a construction has at least one inlet and one outlet for refrigerant along its length. As is well known in the art, the external surface of the sheath or conduit is electrically insulated, for example, with polyimide tape.

Some superconducting materials other than $Nb_3Sn$ which can be used in superconducting cables of the present invention are set forth in Table I.

TABLE I

| Material | $T_c$, °K. | Material | $T_c$, °K. |
|---|---|---|---|
| $Nb_3Al$ | 18.9 | $W_3Si$ | 17.1 |
| $Nb_3Ga$ | 20.3 | $Ti_3Ir$ | 4.3 |
| $Nb_3Ge$ | 23.0 | $V_3Al$ | 16.5 |
| $V_3Ga$ | 15.4 | $Nb_3Pt$ | 10.6 |
| $Nb_3Au$ | 10.6 | $Mo_3Os$ | 12.7 |

The so-called A-15 materials set forth in Table I can generally be produced by interdiffusion of elemental precursor mixtures at about 1000° K. or higher. The mixtures may be of elemental or alloy powders or may be in the form of layered structures such as tin-plated or tin-dipped niobium-copper filament. Those skilled in the art will appreciate that the compositions $Nb_3Sn$ and those in Table I can be varied somewhat in stoichiometry by doping or mixing to provide superconducting materials having particular advantage in special situations.

A superconductor just announced which may be advantageous to use in superconducting cables of the present invention and which has the potential for becoming superconductive at temperatures of liquid nitrogen and above is an oxidic type. This oxidic type of superconductor comprises one or more phases present in reacted oxide materials corresponding to the formula $M_xN_{(5-x)}Cu_5O_{5(3-y)}$ where M is a divalent element preferably selected from the group of strontium and barium, N is a trivalent element selected from the group of scandium, yttrium and the lanthanides, x is a number between about 0.5 and 1.5 and y is a number in excess of 0 and below about 0.5. Such oxidic phases can be formed as thin elongated films on the surfaces of auxiliary conductor inert substrates.

Speaking particularly with respect to $Nb_3Sn$, the sheath of the cable of the present invention is a reasonable match in coefficient of expansion with this particular type II superconductor, especially if the $Nb_3Sn$ is in the form of a composite copper-bronze strand. The sheath alloy useful in the cable of the present invention can be made within the alloy ranges as set forth in Table II.

TABLE II

| Element | Composition Range |
|---|---|
| Nickel | 46–50 |
| Chromium | 3–6 |
| Niobium | 2.5–3.5 |
| Titanium | 1.25–1.65 |
| Aluminum | 0.8–1.2 |
| Silicon | 0.01–0.3 |
| Manganese | up to 1 |
| Cobalt | 0.5 max. |
| Iron | Bal. |

With respect to superconducting cables of the kind contemplated in the present invention, it is vital that the sheath material be able to withstand aging for long periods of time at temperatures of about 1000° K. without deleteriously affecting its mechanical characteristics at cryogenic temperatures, e.g. about 4° K. Normally, low coefficient of expansion alloys similar to but different from the alloys of the range set forth in Table II are age-hardened after solution treatment by holding at about 990° K. for about 8 hours, furnace cooling at a rate of about 55° in Kelvin units per hour to about 895° K. and holding at that temperature for 8 hours and then cooling in air. In constructing superconducting cable as contemplated in the present invention, the cable sheath is built up from thin, e.g. about 1.6 mm strip. The cable sheath encloses the superconductor precursor materials as well as associated structures. After the sheath is formed by bending, welding, etc. the thin strip and the sheath and enclosed components are placed in final cable configuration, e.g. flat, toroidal or other coil form, the assemblege is subjected to temperatures of 1000° K. for times of the order of 50 to 100 hours. This exposure constitutes overaging for an age-hardenable, low coefficient of expansion alloy. The sheath of the cable of the present invention must withstand this overaging without significant detrimental effect.

Two heats of alloy were made containing elements, in weight percent, as set forth in Table III.

TABLE III

| Element | Alloy A | Alloy B |
|---|---|---|
| C | .013 | .013 |
| Mn | .09 | .09 |
| Fe | 40.76 | 40.83 |
| S | .001 | .001 |
| Si | .16 | .17 |
| Cu | .001 | .001 |
| Ni | 48.97 | 48.74 |
| Cr | 4.09 | 4.12 |
| Al | 1.08 | 1.10 |
| Ti | 1.52 | 1.54 |
| Co | .015 | .014 |
| Mo | .001 | .001 |
| Cb + Ta | 3.04 | 3.15 |
| P | .0021 | .0018 |
| B | .004 | .004 |

Alloys A and B were produced as 22 kg vacuum induction heats and were cast into ingots of square cross-section about 114 mm per side. After cropping, the ingots were homogenized for 16 hours at about 1464° K. and forged at about 1394° K. After cleaning, a second forging at about 1311° K. was carried out to produce work pieces about 25 mm by 101 mm in cross-section. These work pieces were heated to 1310° K. and then hot rolled to about 20 mm thick. The rolled material was then annealed at 1255° K. and then cold rolled to about 15.9 mm thick. Part of Alloy B was then further hot rolled to about 1.58 mm in thickness.

Both Alloy A and Alloy B exhibited a mean COE in the range of 4°–1000° K. of about $13 \times 10^{-6}$/°K. after an aging treatment for 100 hours at 973° K. When tested at 4° K., Alloy B exhibited the mechanical characteristics set forth in Table IV after solution treatment at 1253° K. for one hour followed by the aging treatments indicated therein.

TABLE IV

| Aging Treatment | 0.2 YS (MPa) | UTS (MPa) | Elong. (%) |
|---|---|---|---|
| 923° K. 200 hr | 1070 | 1780 | 23 |
| 973° K. 100 hr | 1150 | 1770 | 25 |
| 1023° K. 50 hr | 980 | 1610 | 24 |

In each instance fracture at 4° K. was essentially transgranular and ductile.

Room temperature mechanical characteristics of Alloy A measured on specimens taken transversely from cold rolled flat 15.8 mm by 101 mm by 381 mm as variously heat treated are set forth in Table V.

TABLE V

| Anneal* | Age* | 0.2 YS (MPa) | TS (MPa) | El. (%) | RA (%) | Impact Strength Joules |
|---|---|---|---|---|---|---|
| As Cold Rolled | — | 868 | 1068 | 10 | 20 | — |
| 1255° K./1 hr | — | 296 | 682 | 50 | 55 | — |
| 1255° K./1 hr | 973° K./50 hr | 889 | 1268 | 15 | 24 | — |
| 1255° K./1 hr | 898° K./100 hr | 799 | 1096 | 17 | 19 | — |
| 1255° K./1 hr | 923° K./100 hr | 875 | 1233 | 23 | 42 | — |
| As Cold Rolled | 973° K./50 hr | 1102 | 1330 | 14 | 35 | — |
| As Cold Rolled | 898° K./100 hr | 1185 | 1419 | 12 | 32 | 27.1 |
| As Cold Rolled | 923° K./100 hr | 1247 | 1468 | 11 | 25 | — |
| As Cold Rolled | 973° K./100 hr | 1075 | 1337 | 12 | 22 | 27.1 |
| As Cold Rolled | 1023° K./100 hr | 861 | 1158 | 12 | 23 | 27.1 |
| As Cold Rolled | 991° K./8 hrs cool at 55° K./hr to 894° K. hold for 8 hr reheat to 973° K. hold for 100 hrs | 1082 | 1323 | 9 | 18 | 28.5 |

*Heat treatments are followed by air cooling

Stress rupture tests of combination smooth and notched bar specimens of Alloy A given an aging treatment were conducted in air at 922° K. Alloy A proved to be notch ductile with 1500 hours life at 517 MPa. This result indicates that the sheath of the super-conducting cable of the present invention is sufficiently resistant to stress accelerated grain boundary oxidation to withstand the rigors of cable formation and use.

Superconducting cables in accordance with the present invention can be used to form coil to produce magnetic fields useful in nuclear fusion devices, magnetohydrodynamic devices, rail guns, magnetic levitation systems, particle accelerators, imaging machines, generators and motors. Superconducting cables in accordance with the present invention can also be used for power transmission.

The embodiments of the invention in which an exclusive property or privilege is claimed are defined as follows.

1. A superconducting cable comprising an elongated type II superconductor in association with a parallel stabilizing conductor both in heat transfer relationship with at least one passage adapted to carry refrigerant, said superconductor, said stabilizing conductor and said at least one passage being enclosed by a sheath comprising an alloy consisting essentially of about 46–50% nickel, about 3–6% chromium, about 2.5–3.5% niobium, about 1.25–1.65% titanium, about 0.8–1.2% aluminum, and the balance essentially iron.

2. A superconducting cable as in claim 1 wherein the superconductor is an in-situ-formed A-15 type intermetallic compound.

3. A superconducting cable as in claim 2 wherein the superconductor is $Nb_3Sn$.

4. A superconducting cable as in claim 1 wherein the superconductor is an oxidic phase.

* * * * *